United States Patent
Lee et al.

(10) Patent No.: US 8,344,828 B2
(45) Date of Patent: Jan. 1, 2013

(54) METAMATERIAL TRANSMISSION LINE APPARATUS AND METHOD OF IMPLEMENTING THE SAME

(75) Inventors: Bom-Son Lee, Yongin-si (KR); Tack-Gyu Kim, Yongin-si (KR); Jae-Ick Choi, Daejeon-si (KR); Wang-Joo Lee, Daejeon-si (KR)

(73) Assignees: Electronics and Telecommunications Research Institute, Daejeon-Si (KR); Kyung Hee University Industry Academic Cooperation Foundation, Gyeonggi-Do (KR)

( * ) Notice: Subject to any disclaimer, the term of this patent is extended or adjusted under 35 U.S.C. 154(b) by 300 days.

(21) Appl. No.: 12/840,712

(22) Filed: Jul. 21, 2010

(65) Prior Publication Data

US 2011/0148550 A1 Jun. 23, 2011

(30) Foreign Application Priority Data

Dec. 17, 2009 (KR) .......................... 10-2009-0126237
Apr. 22, 2010 (KR) .......................... 10-2010-0037613

(51) Int. Cl.
*H01P 3/08* (2006.01)

(52) U.S. Cl. ........................................ 333/238; 333/246

(58) Field of Classification Search .................... 333/32, 333/33, 238, 246, 1, 204
See application file for complete search history.

(56) References Cited

U.S. PATENT DOCUMENTS

| 7,215,226 | B2 * | 5/2007 | Lee | 333/204 |
| 7,932,793 | B2 * | 4/2011 | Wu et al. | 333/204 |
| 8,232,853 | B2 * | 7/2012 | Ryou et al. | 333/246 |
| 2010/0171574 | A1 * | 7/2010 | Sakiyama et al. | 333/246 |

OTHER PUBLICATIONS

George V. Eleftheriades, "A Generalized Negative-Refractive-Index Transmission-Line (NRI-TL) Metamaterial for Dual-Band and Quad-Band Applications", IEEE Microwave and Wireless Components Letters, vol. 17, No. 6, Jun. 2007, pp. 415-417.

Hyung-Mi Kim et al., "Bandgap and Slow/Fast-Wave Characteristics of Defected Ground Structures (DGSs) Including Left-Handed Features", IEEE Transactions on Microwave Theory and Techniques, vol. 54, No. 7, Jul. 2006, pp. 3113-3120.

Young-Ho Ryu et al., "DGS Dual Composite Right/Left Handed Transmission Line", IEEE Microwave and Wireless Components Letters, vol. 18, No. 7, Jul. 2008, pp. 434-436.

* cited by examiner

*Primary Examiner* — Stephen Jones
(74) *Attorney, Agent, or Firm* — Rabin & Berdo, P.C.

(57) ABSTRACT

A metamaterial transmission line for transmitting an electromagnetic wave. The metamaterial transmission line may include a substrate including a substrate configured to include a an upper portion and a lower portion on which a ground plane is formed, a signal line configured to be formed on the substrate, and a defected ground structure configured to include an etched region and two metal portions, wherein the etched region is generated by etching a part of the ground plane and the metal portions extend from the signal line and are disposed on the etched region.

15 Claims, 5 Drawing Sheets

METAMATERIAL TRANSMISSION LINE APPARATUS AND METHOD OF IMPLEMENTING THE SAME

CROSS-REFERENCE TO RELATED APPLICATION

This application claims the benefit under 35 U.S.C. §119 (a) of a Korean Patent Applications Nos. 10-2009-0126237, filed on Dec. 17, 2009, and 10-2010-0037613, filed on Apr. 22, 2010, the entire disclosures of which are incorporated herein by references for all purposes.

BACKGROUND

1. Field

The following description relates to a transmission line for transmitting electromagnetic waves, and more particularly, to a metamaterial transmission line and a method of fabricating the same.

2. Description of the Related Art

Generally, an electromagnetic wave comprises an electric field, and a magnetic field, and has a transmission direction of power which can be calculated in accordance with the right-hand rule.

A metamaterial transmission line is implemented by forming an artificial structure using thin wires and split ring resonators such that an electromagnetic wave travels along the metamaterial transmission line while directions of an electric field, a magnetic field and a transmission direction of power are formed according to a left-hand rule instead of the right-hand rule.

Experiments of transmitting an electromagnetic wave using thin wires and split ring resonators such that directions of an electric field, a magnetic field and a transmission direction of power are formed according to the left-hand rule originate in the field of optics, but such experiments have been applied to transmission lines and now the research for metamaterials to be utilized in microwave bands is being actively conducted.

A metamaterial transmission line can be realized by adding series capacitors and parallel inductors in a transmission line.

The above structure comes to have a negative propagation constant below a frequency having a zero (0) propagation constant or a transition frequency which is referred to as a zero resonant frequency.

Additionally, in case of a zero propagation constant, the metamaterial transmission line enables electromagnetic waves to propagate while the conventional transmission line cannot allow electromagnetic waves to pass.

Since the propagation constant of the transition frequency is 0, all fields at a corresponding frequency band have the same size, and this is referred to as an infinite wavelength.

Recently, a metamaterial transmission line has been proposed which exhibits two frequencies each having an infinite wavelength, but the structure of such metamaterial transmission line is complex because it has to be implemented with a series capacitors and parallel inductors.

SUMMARY

In one general aspect, provided is a metamaterial transmission line including: a substrate configured to include a lower portion on which a ground plane is formed; a signal line configured to be formed on the substrate; and a defected ground structure configured to include an etched region and two metal portions, wherein the etched region is generated by etching a part of the ground plane and the metal portions extend from the signal line and are disposed on the etched region.

The metamaterial transmission line may further include a ground via configured to be formed from the signal line to the ground plane. The metamaterial transmission line may further include a series capacitor unit configured to include an interdigital capacitor formed by etching a part of the signal line. The metamaterial transmission line may further include a rectangular patch structure and a parallel stub to connect the rectangular patch structure to the signal line and change impedance of the rectangular patch structure.

In another general aspect, provided is a method of fabricating a metamaterial transmission line, the method including: etching a part of a ground plane which is formed on a lower portion of a substrate and a part of a signal line formed on the substrate; and inserting two metal portions that extend from the signal line into the etched region.

Other features and aspects will be apparent from the following detailed description, the drawings, and the claims.

Figure 1:
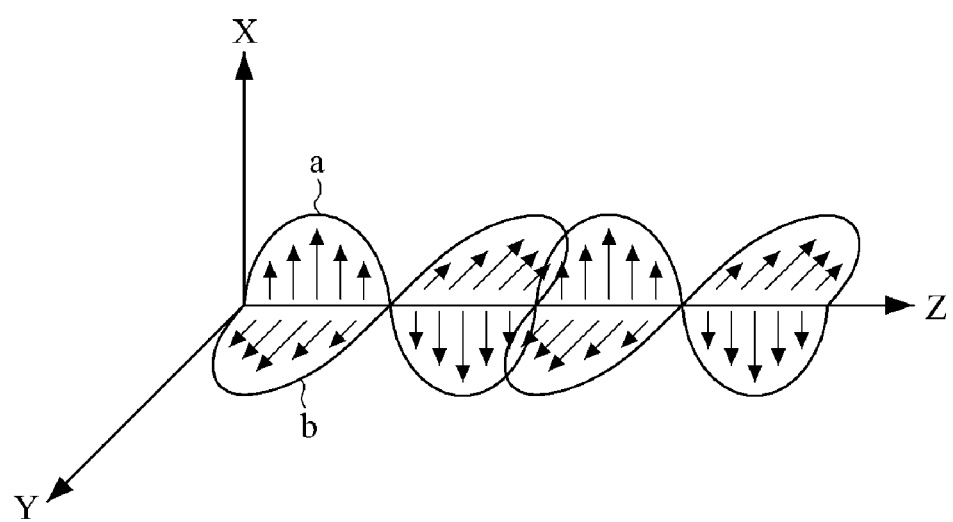
FIG. 1 is a diagram illustrating an example of electric field distribution and magnetic field distribution of a general transmission line.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

FIG. 1 illustrates an example of electric field distribution and magnetic field distribution in a general transmission line. As shown in the example illustrated in FIG. 1, in case of electromagnetic wave propagation along the transmission line, directions of an electric field a, a magnetic field b, and a transmission direction of power are determined and maintained in accordance with the right-hand rule. As shown in FIG. 1, the intensity of each of the electric field and the magnetic field is in the form of a sine wave.

Figure 2:
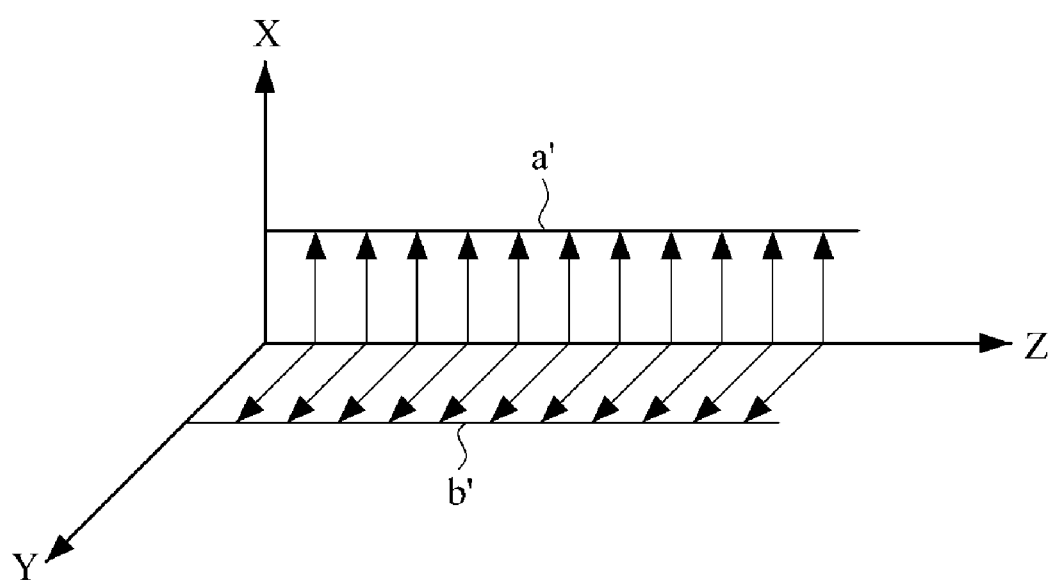
FIG. 2 is a diagram illustrating an example of electric field distribution and magnetic field distribution in a metamaterial transmission line.

FIG. 2 illustrates an example of electric field distribution and magnetic field distribution in a metamaterial transmission line. The metamaterial transmission line is implemented by artificially adding series capacitors and parallel inductors in an existing transmission line to make the propagation constant zero (0) or a negative value.

If matching conditions are satisfied when the capacitors and inductors are added in the transmission line at specific intervals from each other, wave propagation occurs well over a wide band without a stop band, and in some cases, the propagation constant may become 0 or a negative value.

As shown in the example illustrated in FIG. 2, in a case where the propagation constant is 0, an electric field a' and a magnetic field b' have the same intensity inside a single cell, unlike in the general transmission line.

A frequency at which the propagation constant becomes 0 is referred to as a transition frequency or a zero resonant frequency. When the matching conditions are satisfied, all frequencies near the transition frequency form pass bands. At this time, the electric field a' and the magnetic field b' have the same direction and intensity at the transition frequency inside the single cell, and accordingly an infinite wavelength is formed.

A conventional metamaterial transmission line may have one zero resonant frequency. Recently, a new metamaterial transmission line having two zero resonant frequencies has been actively researched.

Figure 3:
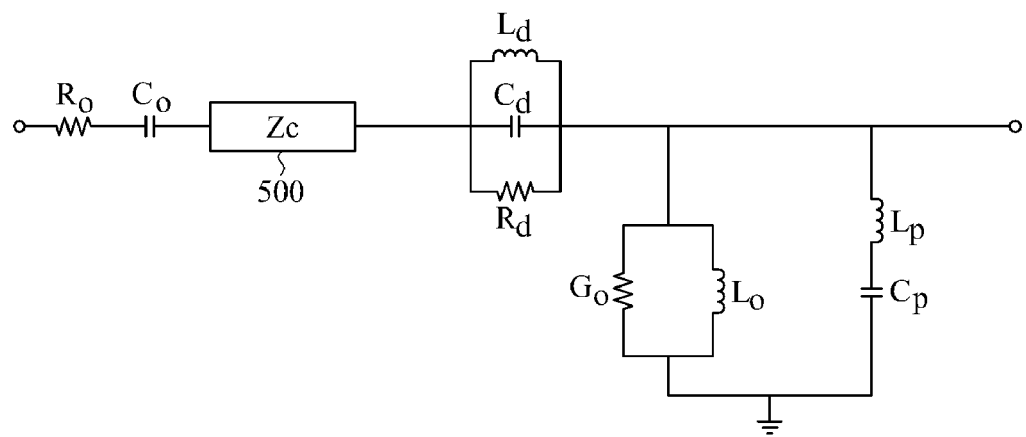
FIG. 3 is a diagram illustrating an example of an equivalent circuitry of a metamaterial transmission line.

FIG. 3 illustrates an example of an equivalent circuitry of a metamaterial transmission line. In the example illustrated in FIG. 3, constituent circuit elements are divided into lumped constant elements and distributed constant element. A transmission line 500 is a distributed constant element, and the remaining elements are lumped constant elements. The transmission line 500 has series inductances (L [H/m]) and parallel capacitances (C [F/m]) per unit length within a size d of the single cell. Thus, within the size d of the single cell, distribution constant values can be represented as lumped constant values. The entire transmission line 500 has a value of Ld(H) as series inductance and a value of Cd(F) as parallel capacitance. Therefore, the equivalent circuitry shown in the example illustrated in FIG. 3 includes four constituent resonant circuits including a horizontal series resonant circuit formed of series inductance Ld and series capacitance Co of the transmission line 500, a resonant circuit formed by parallel capacitance Cd of the transmission line 500 and parallel inductance Lo of a vertical branch, and a horizontal parallel resonant circuit including Ld and Cd, which is caused by a defective ground structure (DGS), and a vertical series resonant circuit including Lp and Cp of the vertical branch.

Under the assumption that all resonant circuits have the same resonant frequency $\omega 0$, Co, Ld, Lp and Cd are activated at a frequency below $\omega 0$, and Ld, Cd, Cp, and Lo are activated above $\omega 0$. Thus, the equivalent circuitry shown in FIG. 3 has the effect that there is the metamaterial transmission line with two zero resonant frequencies. Also, the equivalent circuitry has a stop band at the resonant frequency $\omega 0$ of all circuits.

The equivalent circuitry shown in the example illustrated in FIG. 3 has two zero resonant circuits having zero resonant frequencies which are denoted by $\omega z1$ and $\omega z2$, respectively (where $\omega z1 < \omega 0 < \omega z2$). In the frequency range below $\omega z1$, a left-hand (LH) band is obtained which has a negative propagation constant, and in the frequency range above $\omega z1$, a right-hand (RH) band is obtained which has a positive propagation constant. In the frequency range close to $\omega o$, the equivalent circuitry has a stop band. In a similar manner, in the frequency range below $\omega z2$ a right-hand (RH) band is obtained which has a negative propagation constant, and in the frequency range above $\omega z2$, a left-hand (LH) band is obtained which has a positive propagation constant.

In one example, stop bands are exhibited around the two zero resonant frequencies when random values are input as capacitance and inductance of the equivalent circuitry illustrated in FIG. 3. To remove the stop bands and achieve a wider pass band, a matching condition is required for the dual zero resonant circuit. For example, the equivalent circuitry may be designed to satisfy a condition, for example, (Lp)Cd=Lp(Cd).

Figure 4:
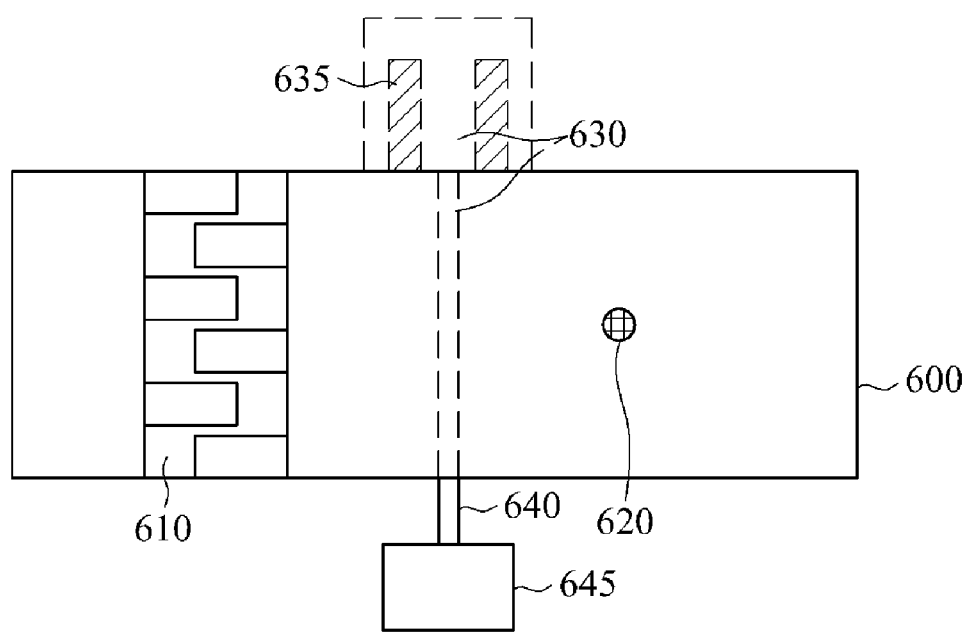
FIG. 4 is a diagram illustrating an example of a single cell model of a metamaterial transmission line.

FIG. 4 illustrates an example of a metamaterial transmission line. As shown in the example illustrated in FIG. 4, the metamaterial transmission line includes a signal line 600, a defective ground structure (DGS), a ground via 620, a series capacitor unit 610, a parallel stub 640, and a rectangular patch structure 645.

The signal line 600 is formed on an upper portion of a substrate, on a lower portion of which a ground plane is formed. The signal line 600 may be implemented as a general transmission line.

The DGS is formed at only one end of the signal line 600. Accordingly, the structure of the metamaterial transmission line can be simplified and the interference which may occur when two DGSes are disposed at both ends of the signal line 600 can be minimized.

In one example, the DGS may include an etched region 630 that is formed by etching a part of the ground plane, and two metal portions 635, each of which extends from the signal line 600 and is formed inside the etched region 630. Each of the metal portions 635 may be implemented as a conductor of various types. The DGS is configured to be T-shaped.

The DGS may be used to define a unit element and to build an equivalent circuit model. In addition, desired periodic structure characteristics can be achieved by periodically arranging only a small number of DGSes. The design and implementation of the DGS is simple and thus the DGS is advantageously suited for microwave circuit design.

By etching a part of the ground plane and inserting the metal portions 635 into the etched region, a low capacitance value can be increased without significant inductance value damage in the DGS. Accordingly, capacitors and inductors can be easily implemented and the efficiency can be increased.

In addition, the horizontal parallel capacitances most of which can be implemented on the etched portion below the transmission line allow the design of a simple circuit structure.

In one example, the series capacitor unit 610 includes an interdigital capacitor. The series capacitor unit 610 may be configured to be in the form of a meander line to complement the low capacitance of a general gap capacitor.

If a design frequency requires a small capacitance, a gap capacitor may be adequate, but if the desired capacitance is large, the number of fingers of the meander line may be increased to enhance the capacitance between the fingers.

In another example, the metamaterial transmission line includes the ground via 620 that is directly connected from the transmission line 600 to the ground plane. The ground via 620 may allow implementation of a vertical parallel inductance. At high frequency, interference with the DGS may occur, and to prevent such interference, the ground via 620 may be formed to be directly connected from the transmission line 600 to the ground plane, thereby easily realizing the inductance.

In addition, the inductance value may be varied with the radius of the ground via 620. Although the inductance value can be adjusted by changing the height of a substrate, since parameters of the other elements have to be correspondingly adjusted, it is easier to control the inductance value using the radius of the ground via 620.

The metamaterial transmission line includes a resonant circuit formed by the parallel stub 640 and the rectangular patch structure 645. The resonant circuit may perform a function corresponding to the conventional vertical series resonant circuit formed by Lp and Cp shown in an example illustrated in FIG. 3. That is, the resonant circuit formed by the parallel stub 640 and the rectangular patch structure 645 allows the parallel stub 640 to implement vertical series inductance and capacitance. The inductance may be adjusted by changing the length of the parallel stub 640, and the capacitance may be adjusted by changing the width of the rectangular patch structure 645.

Figure 5:
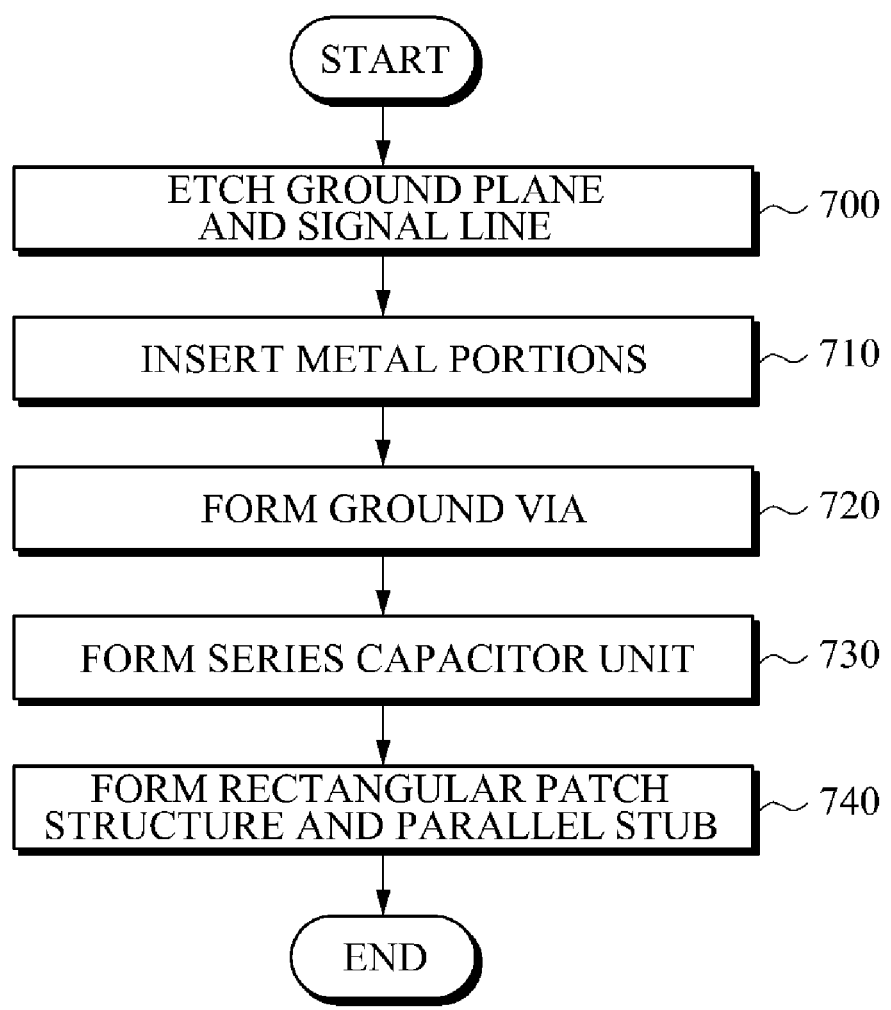
FIG. 5 is a flowchart of an example of a method of fabricating a metamaterial transmission line.

FIG. 5 illustrates a flowchart of an example of a method of fabricating a metamaterial transmission line. A signal line is disposed on a substrate, which has a lower portion on which a ground plane is formed. Then, a part of the ground plane on the lower portion of the substrate and a part of the signal line are etched (700). Two metal portions extending from the signal line are inserted into the etched region to form a DGS (710). In one example, the DGS is disposed at only one end of the signal line. Accordingly, the structure of the metamaterial transmission line can be simplified, and the interference with a series resonant structure, which may occur when two DGSes are disposed at both ends of the signal line, can be minimized. Each of the metal portions may be implemented as a capacitor, and may vary in their types. The DGS may be T-shaped. Thus, the capacitors and inductors can be simply implemented, and an increase in efficiency can be achieved.

Thereafter, a ground via is formed from the signal line to the ground plane (720). The ground via allows implementation of a vertical parallel inductance. Since the interference with the DGS may occur at a high frequency, to prevent such interference, the ground via is formed to directly connect between the signal line and the ground plane, and thus the inductance can be more simply realized.

In addition, the inductance value may be controlled with the radius of the ground via. Although the inductance value can be adjusted by changing the height of the substrate, it is easier to control the inductance value by changing the radius of the ground via because parameters of the other elements have to be readjusted when the height of the substrate is changed.

Then, at least a part of the signal line is etched to form a series capacitor unit. At this time, the signal line may be etched in the form of a meander line.

If a design frequency requires a small capacitance, a gap capacitor may be adequate, but when the large capacitance is desired, the number of fingers of the meander line is increased to enhance the capacitance between the fingers.

Then, a rectangular patch structure is formed and connected to the signal line to form a parallel stub that changes the impedance of the rectangular patch structure, thereby implementing a resonant circuit (740). The resonant circuit formed by the parallel stub and the rectangular patch structure may allow the parallel stub to implement vertical series inductance and capacitance. In one example, the inductance may be adjusted by controlling the length of the parallel stub, and the capacitance may be adjusted by controlling the width of the rectangular patch structure.

According to the above examples, the metamaterial transmission line can be more simply implemented, and the influence from interference at high frequency can be reduced, thereby solving the interference problem.

That is, the metamaterial transmission line using an advanced DGS has two zero resonant frequencies, and can generate an infinite wavelength and a negative propagation constant. Additionally, the metamaterial transmission line can be implemented at a random frequency or a high frequency without interference.

In addition, the above method of fabricating the metamaterial transmission line can be implemented as computer readable codes in a computer readable record medium. Codes and code segments constituting the computer program can be easily inferred by a skilled computer programmer in the art. The computer readable record medium includes all types of record media in which computer readable data are stored. Examples of the computer readable record medium include a ROM, a RAM, a CD-ROM, a magnetic tape, a floppy disk, and an optical data storage. Further, the record medium may be implemented in the form of a carrier wave such as Internet transmission. In addition, the computer readable record medium may be distributed to computer systems over a network, in which computer readable codes may be stored and executed in a distributed manner.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A metamaterial transmission line comprising:
    a substrate configured to include a lower portion on which a ground plane is formed;
    a signal line configured to be formed on the substrate; and
    a defected ground structure configured to include an etched region and two metal portions, wherein the etched region is generated by etching a part of the ground plane and the metal portions extend from the signal line and are disposed on the etched region.

2. The metamaterial transmission line of claim 1, wherein the etched region is formed along at least a part of the metal portions.

3. The metamaterial transmission line of claim 1, wherein the etched region is formed to connect a region between the two metal portions and the etched region of the signal line.

4. The metamaterial transmission line of claim 1, further comprising:
    a ground via configured to be formed from the signal line to the ground plane.

5. The metamaterial transmission line of claim 4, wherein an inductance value is varied with the radius of the ground via.

6. The metamaterial transmission line of claim 1, further comprising:
    a series capacitor unit configured to include an interdigital capacitor formed by etching a part of the signal line.

7. The metamaterial transmission line of claim 6, wherein the series capacitor unit is formed by etching a part of the signal line in the form of a meander line.

8. The metamaterial transmission line of claim 1, further comprising:
    a rectangular patch structure; and
    a parallel stub to connect the rectangular patch structure to the signal line and change impedance of the rectangular patch structure.

9. The metamaterial transmission line of claim 8, wherein inductance is varied with the length of the parallel stub.

10. The metamaterial transmission line of claim 8, wherein capacitance is varied with the width of the rectangular patch structure.

11. A method of fabricating a metamaterial transmission line, the method comprising:

etching a part of a ground plane which is formed on a lower portion of a substrate and a part of a signal line formed on the substrate; and inserting two metal portions that extend from the signal line into the etched region.

12. The method of claim 11, further comprising:

forming a ground via from the signal line to the ground plane.

13. The method of claim 11, further comprising:

forming a rectangular patch structure; and forming a parallel stub by connecting the rectangular patch structure to the signal line to change impedance of the rectangular patch structure.

14. The method of claim 11, further comprising:

forming a series capacitor unit by etching at least a part of the signal line.

15. The method of claim 14, wherein the forming of the series capacitor unit includes etching the part of the signal line in the form of a meander line to from the series capacitor.

* * * * *